United States Patent
Kwon et al.

(10) Patent No.: US 9,548,114 B2
(45) Date of Patent: Jan. 17, 2017

(54) RESISTIVE SEMICONDUCTOR MEMORY CAPABLE OF PERFORMING INCREMENTAL STEP PULSE PROGRAMMING (ISPP) BASED ON DIGITAL CODE VALUES OF MEMORY CELLS

(71) Applicant: RESEARCH & BUSINESS FOUNDATION SUNGKYUNKWAN UNIVERSITY, Suwon-si (KR)

(72) Inventors: Keewon Kwon, Seongnam-si (KR); Jongmin Baek, Imsil-gun (KR); Dongjin Seo, Gwangju (KR)

(73) Assignee: RESEARCH & BUSINESS FOUNDATION SUNGKYUNKWAN UNIVERSITY, Suwon-si (KR)

( * ) Notice: Subject to any disclaimer, the term of this patent is extended or adjusted under 35 U.S.C. 154(b) by 0 days.

(21) Appl. No.: 14/068,382

(22) Filed: Oct. 31, 2013

(65) Prior Publication Data
US 2014/0119096 A1   May 1, 2014

(30) Foreign Application Priority Data
Oct. 31, 2012 (KR) ........................ 10-2012-0122369

(51) Int. Cl.
*G11C 13/00* (2006.01)

(52) U.S. Cl.
CPC ....... *G11C 13/0069* (2013.01); *G11C 13/0064* (2013.01)

(58) Field of Classification Search
CPC ............. G11C 11/5614; G11C 11/5678; G11C 13/0011; G11C 13/0004; G11C 13/0035; G11C 13/0064; G11C 13/0069; G11C 2013/0092; G11C 11/5685; G11C 13/0007

USPC .......... 365/148, 163, 189.16, 189.09, 189.11
See application file for complete search history.

(56) References Cited

U.S. PATENT DOCUMENTS

| | | | | |
|---|---|---|---|---|
| 7,272,047 B2* | 9/2007 | Chae et al. | ............... | 365/185.19 |
| 7,633,804 B2* | 12/2009 | Nobunaga | ................ | 365/185.19 |
| 8,031,517 B2* | 10/2011 | Kim et al. | ..................... | 365/163 |
| 8,130,129 B2* | 3/2012 | Oettinger et al. | ............ | 341/155 |
| 2008/0294217 A1* | 11/2008 | Lian et al. | ....................... | 607/28 |
| 2009/0238006 A1* | 9/2009 | Nobunaga | ................ | 365/185.19 |

FOREIGN PATENT DOCUMENTS

| | | | | |
|---|---|---|---|---|
| KR | 10-2010-0013125 | * | 2/2010 | ............. G11C 16/34 |
| KR | 10-2010-0013125 A | | 2/2010 | |

OTHER PUBLICATIONS

"Analog to Digital Converters", Zhu et al., pp. 1-57, date unavailable.*

* cited by examiner

Primary Examiner — Andrew Q Tran
(74) Attorney, Agent, or Firm — NSIP Law

(57) ABSTRACT

Disclosed are a semiconductor memory apparatus, a program method, and a program system. The semiconductor memory apparatus includes a memory cell array including a plurality of resistive memory cells and a control block configured to variably control, based on digital code values reflecting resistance states of the resistive memory cells, at least one of a initial voltage magnitude and an initial voltage applying time in an incremental step pulse programming (ISPP) mode for the plurality of memory cells. Therefore, even in the case of the worst cell, the incremental step of the ISPP may be minimized, and the writing time may be reduced, limiting unnecessary current consumption.

19 Claims, 16 Drawing Sheets

RESISTIVE SEMICONDUCTOR MEMORY CAPABLE OF PERFORMING INCREMENTAL STEP PULSE PROGRAMMING (ISPP) BASED ON DIGITAL CODE VALUES OF MEMORY CELLS

This application claims the benefit of priority of Korean Patent Application No. 10-2012-0122369 filed on Oct. 31, 2012, which is incorporated by reference in its entirety herein.

BACKGROUND OF THE INVENTION

Field of the Invention

The present invention relates to a semiconductor memory apparatus, and a program method and a program system, and more particularly, to a semiconductor memory apparatus, and a program method and a program system based on writing distribution control of a ReRAM memory.

Discussion of the Related Art

Recently, as devices have rapidly been reduced in size, the number of charges stored in a nonvolatile memory based on the charges, including a flash memory, is limited. Therefore, a resistive random access memory (ReRAM) has been considered as a replacement memory for overcoming this limitation due to reduction in the size of devices. The ReRAM is a nonvolatile memory having a characteristic in which a resistance of a cell is variable by a voltage or a current applied to the cell, and has advantages of having a large margin for sensing data and having a relatively fast speed and low power consumption as compared with other nonvolatile memories. However, since a writing operation in the resistive memory has statistical distribution by a random change like flash memory, voltages switching the resistance are different from each other for each cell, and as a result, when the same writing voltage is applied to all the cells, the writing distribution is increased and thus it is difficult to sense the data.

Studies for controlling the writing distribution in the resistive change memory have been actively conducted.

FIG. 1A is a circuit diagram illustrating a circuit configuration for controlling writing distribution in an existing resistive memory disclosed in Korean Patent Publication No. 10-2010-0013125, and FIG. 1B is a graph illustrating an example of a writing method using the circuit.

Referring to FIGS. 1A and 1B, a read verify circuit is represented by a dotted circle. The read verify circuit compares a voltage (or current) corresponding to a current read from a cell to a reference voltage (or current). As illustrated in FIG. 1B, the cell resistance distribution is controlled by increasing and verifying again a reset voltage applying time. Further, in Korean Patent Publication No. 10-2010-0013125, the circuit is configured to vary the voltage applying time and the voltage magnitude together. However, in the case of Korean Patent Publication No. 10-2010-0013125, when considering the resistance distribution of all the cells, in the case of the worst cell, the number of steps of varying the voltage applying time (or the applying voltage magnitude) may be increased by an allowable maximum number, and therefore, there is a problem in that a writing speed and an unnecessary current consumed in each step are generated.

SUMMARY OF THE INVENTION

In order to solve the above-mentioned problems, an aspect of the present invention provides a semiconductor memory apparatus, and a program method and a program system that control at least one of a magnitude of an initial voltage and a voltage applying time to be variable in an incremental step pulse programming (ISPP) mode during a writing operation for a memory cell based on a digital code value reflecting a resistive state of a resistive memory cell.

In accordance with an embodiment of the present invention, a semiconductor memory apparatus, including: a memory cell array includes: a plurality of resistive memory cells; and a control block configured to control at least one of a initial voltage magnitude and an initial voltage applying time in an ISPP mode for the plurality of memory cells to be variable based on digital code values reflecting resistance states of the plurality of resistive memory cells.

A digital code value of at least 2 bits, according to a degree of deviation from a target value of the resistance state of the plurality of resistive memory cells, is generated by monitoring the resistance state of the plurality of resistive memory cells.

The semiconductor memory apparatus may further include an analog to digital converter (ADC) configured to generate the digital code value.

The control block may classify one state value (including SET(1) or RESET(0)) of the plurality of resistive memory cells into at least two levels based on the digital code value.

The control block may read a most significant bit value of the digital code value, and classifies levels based on the rest of bit values, except for the most significant bit value of the digital code value, to group the plurality of resistive memory cells according to the classified levels.

In the case where the digital code value has a length value of 4 bits, the control block may classify one state value of the resistive memory cell into three levels (including a first level, a second level and a third level) based on three lower bits of the digital code value, and group the plurality of resistive memory cells according to the first to third levels.

The control block may: control the resistive memory cell of the first level to perform the ISPP mode while sequentially increasing a voltage magnitude or a voltage applying time based on a predetermined initial voltage magnitude or initial voltage applying time; control the resistive memory cell of the second level to perform the ISPP mode while applying the initial voltage magnitude or the initial voltage applying time which is larger or longer than the resistive memory cell of the first level; and control the resistive memory cell of the third level to perform the ISPP mode while applying the initial voltage magnitude or the initial voltage applying time which is larger or longer than the first and second resistive memory cells.

The semiconductor memory apparatus may further include a DC generator including a plurality of switches in order to apply different initial voltages to the plurality of resistive memory cells.

The DC generator may control opening and closing of the plurality of switches based on the control signal associated with the initial applying voltage or the initial voltage applying time for the plurality of resistive memory cells to apply the voltages to the plurality of resistive memory cells.

When the plurality of memory cells are connected to one word line simultaneously, for instance during a writing operation, the memory cells share one power line. The control block may variably control a magnitude of the initial voltage applied through a bit line according to the digital code value, while the initial applying voltages through the word line are the same as each other in the ISPP mode with respect to the plurality of memory cells connected thereto.

In accordance with another embodiment of the present invention, a program method of a semiconductor memory apparatus includes: generating a digital code value reflecting a resistance state of a plurality of resistive memory cells; and controlling at least one of a magnitude of an initial voltage and an initial voltage applying time to be variable in an ISPP mode with respect to the plurality of resistive memory cells based on the generated digital code value.

The generating of the digital code value may include monitoring the resistance state of the plurality of resistive memory cells, determining a degree of deviation from a target value of the resistance state of the plurality of resistive memory cells, and assigning a digital code value of predetermined bits according to the degree of deviation.

The controlling may include classifying one state value (including SET(1) or RESET(0)) of the plurality of resistive memory cells into at least two levels based on the digital code value.

The controlling may include reading a most significant bit value of the digital code value as a state value, and classifying one state value of the resistive memory cell into at least two levels based on the rest of bit values except for the most significant bit value of the digital code value.

In the case where the digital code value has a length value of 4 bits, the controlling may include classifying one state value of the resistive memory cell into three levels (including a first level, a second level and a third level) based on three lower bits of the digital code value.

The controlling may include: controlling the resistive memory cell of the first level to perform the ISPP mode while sequentially increasing a voltage magnitude or a voltage applying time based on a predetermined initial voltage magnitude or initial voltage applying time; controlling the resistive memory cell of the second level to perform the ISPP mode while applying the initial voltage magnitude or the initial voltage applying time which is larger or longer than the resistive memory cell of the first level; and controlling the resistive memory cell of the third level to perform the ISPP mode while applying the magnitude of the initial applying voltage or the initial voltage applying time which is larger or longer than the first and second resistive memory cells.

The program method of a semiconductor memory apparatus may further include applying different initial voltages to the plurality of resistive memory cells based on the control signal associated with the initial applying voltage or the initial voltage applying time.

When the plurality of memory cells are connected to one word line simultaneously, for instance during a writing operation, the memory cells share one power line. The controlling may include variably controlling a magnitude of the initial voltage applied through the bit line according to the digital code value, while the initial applying voltages through the word line are the same as each other in the ISPP mode with respect to the plurality of memory cells.

In accordance with yet another embodiment of the present invention, a semiconductor memory system includes: a semiconductor memory apparatus and a processor for controlling a writing operation and a verify read operation of the semiconductor memory apparatus. The semiconductor memory apparatus includes a memory cell array, including a plurality of resistive memory cells, and a control block configured to variably control at least one of a magnitude of an initial voltage and an initial voltage applying time in an ISPP mode for the plurality of memory cells, based on digital code values reflecting resistance states of the plurality of resistive memory cells.

The digital code value may be generated by monitoring the resistance state of the plurality of resistive memory cells, determining a degree of deviation from a target value of the resistance state of the plurality of resistive memory cells, and assigning a digital code value of predetermined bits according to the degree of deviation.

According to another embodiment of the present invention, the semiconductor memory apparatus and the program method and system of the present invention, even in the worst cell, an incremental step of incremental step pulse programming (ISPP) may be minimized, thereby reducing a writing time and reducing unnecessary current consumption.

DETAILED DESCRIPTION OF THE EMBODIMENTS

Figure 1A:
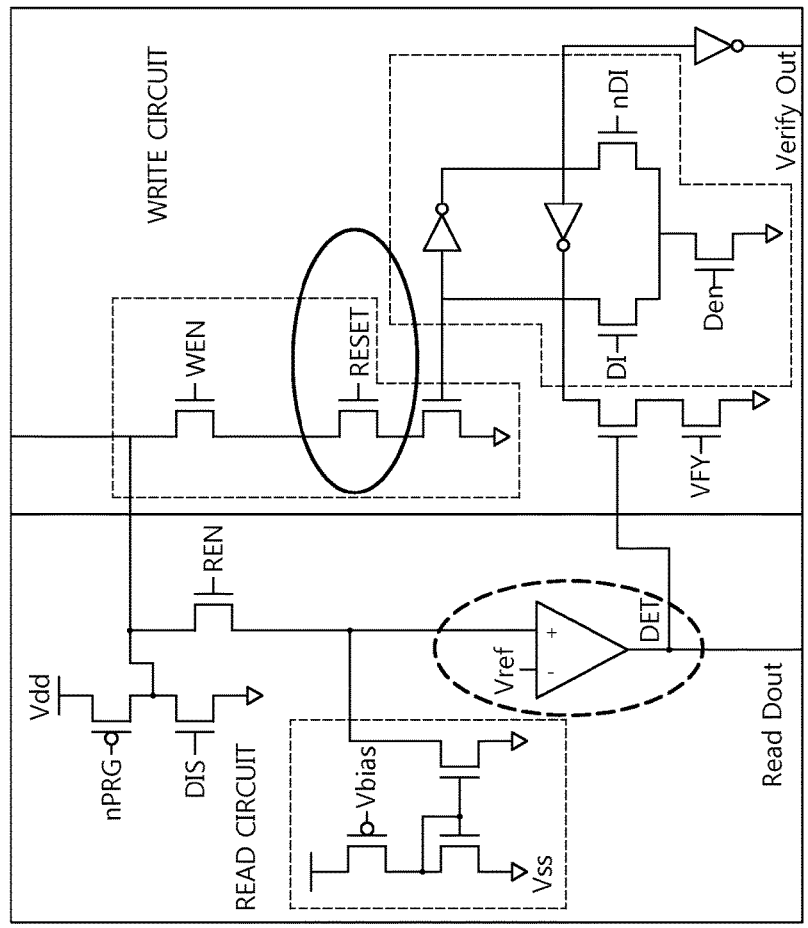
FIG. 1A is a circuit diagram illustrating a circuit configuration for writing distribution control in a resistive memory in the related art.
Figure 1B:
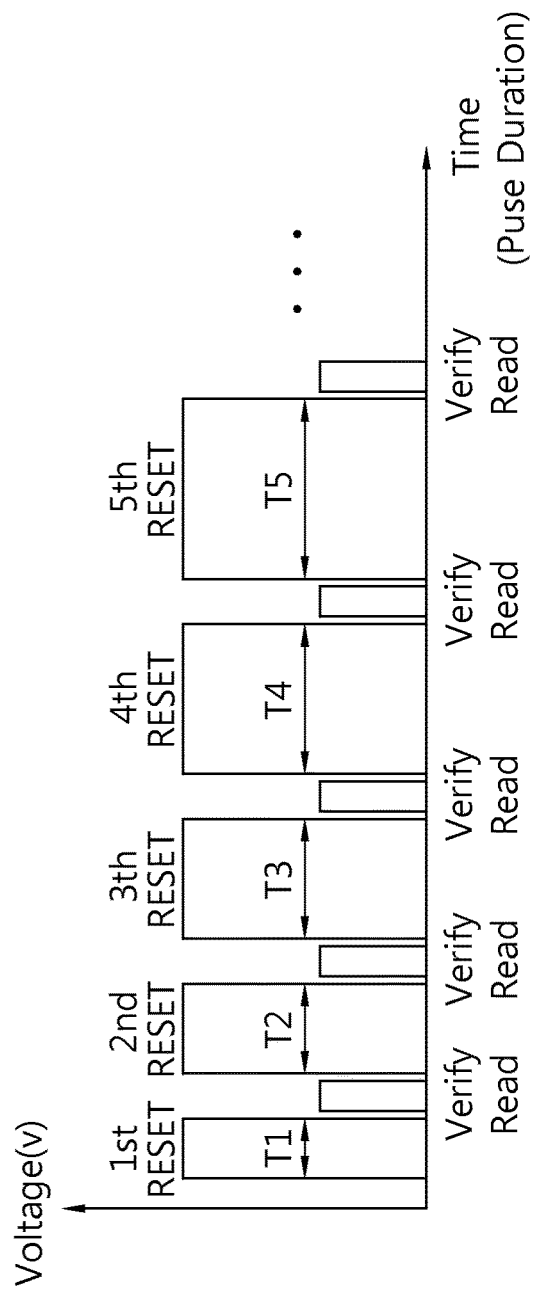
FIG. 1B is a graph illustrating an example of a writing method using the circuit.

The present invention may have various modifications and various exemplary embodiments and specific exemplary embodiments will be illustrated in the drawings and described in detail.

However, this does not limit the present invention within specific exemplary embodiments, and it should be understood that the present invention covers all the modifications, equivalents and replacements within the idea and technical scope of the present invention.

Terms such as first or second may be used to describe various components but the components are not limited by the above terminologies. The above terminologies are used only to discriminate one component from the other component. For example, without departing from the scope of the present invention, a first component may be referred to as a second component, and similarly, a second component may be referred to as a first component. A terminology such as and/or includes a combination of a plurality of associated items or any item of the plurality of associated items.

It should be understood that, when it is described that an element is "coupled" or "connected" to another element, the element may be "directly coupled" or "directly connected" to the another element or "coupled" or "connected" to the another element through a third element. In contrast, it should be understood that, when it is described that an element is "directly coupled" or "directly connected" to another element, it is understood that no element is not present between the element and the another element.

Terms used in the present application are used only to describe specific exemplary embodiments, and are not intended to limit the present invention. A singular form may include a plural form if there is no clearly opposite meaning in the context. In the present invention, it should be understood that term "include" indicates that a feature, a number, a step, an operation, a component, a part or the combination thereof described in the specification is present, but does not exclude a possibility of presence or addition of one or more other features, numbers, steps, operations, components, parts or combinations, in advance.

If it is not contrarily defined, all terms used herein including technological or scientific terms have the same meaning as those generally understood by a person with ordinary skill in the art. Terms which are defined in a generally used dictionary should be interpreted to have the same meaning as the meaning in the context of the related art but are not interpreted as an ideally or excessively formal meaning if it is not clearly defined in the present invention.

Hereinafter, preferable embodiments of the present invention will be described in more detail with reference to the accompanying drawings. In describing the present invention, like reference numerals refer to like elements for easy overall understanding and a duplicated description of like elements will be omitted.

Figure 2:
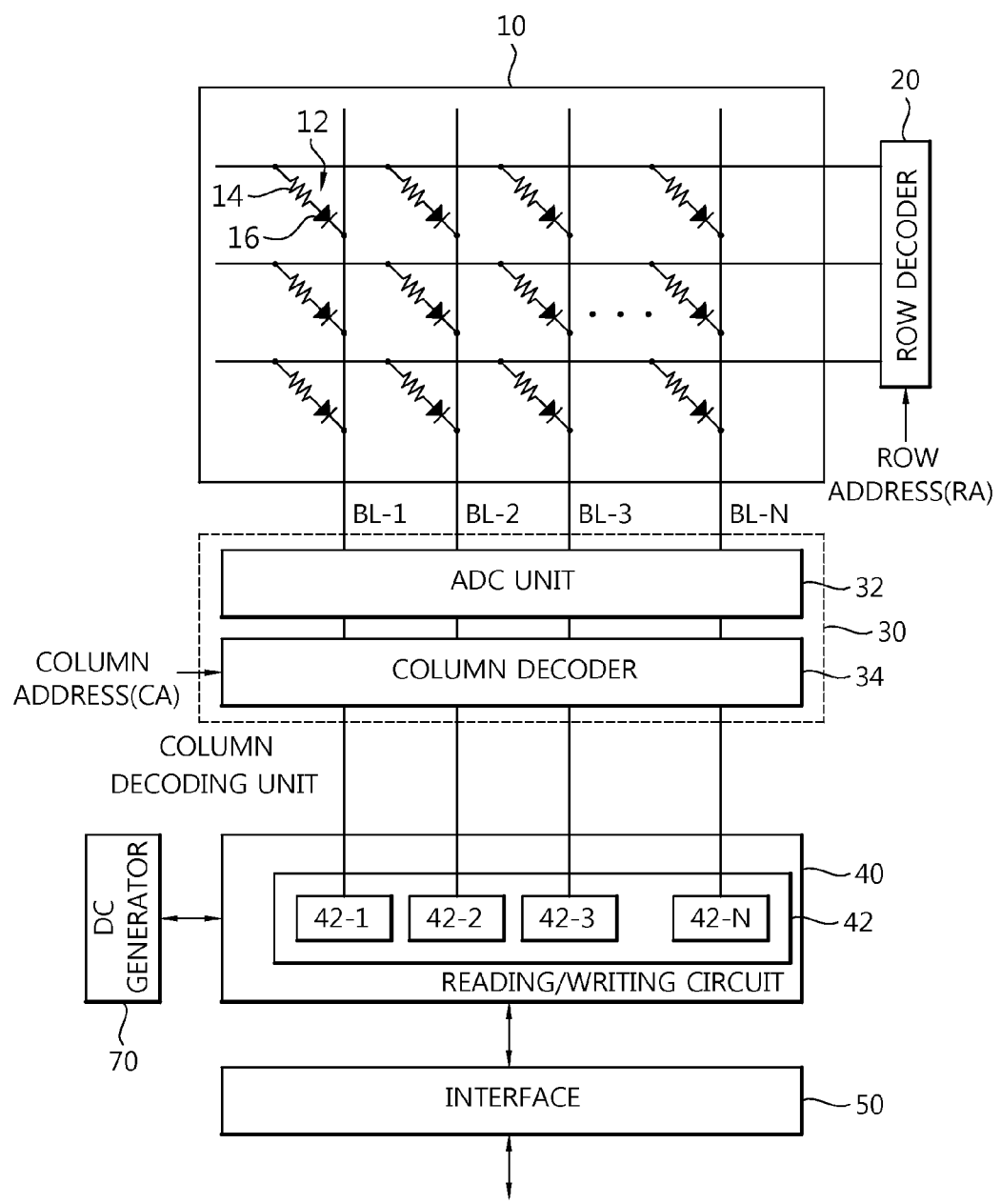
FIG. 2 is a schematic block diagram of a semiconductor memory apparatus according to an embodiment of the present invention.

FIG. 2 is a schematic block diagram of a semiconductor memory apparatus according to an embodiment of the present invention. As illustrated in FIG. 2, a semiconductor memory apparatus may include a memory cell array 10, a row decoder 20, a column decoder 30, a control block 40, an interface 50, and a DC generator 70.

The memory cell array 10 may include a plurality of bit lines BL1 to BLN, a plurality of word lines WL1, WL2, WL3, . . . WLN, and a plurality of resistive memory cells 12.

The plurality of resistive memory cells 12 each uses a resistance of a resistive memory element 14 in order to store one bit or one or more bits of data. For example, a resistive memory element 14 programmed to have a high resistance may express a logic "0" data bit value, and a resistive memory element 14 programmed to have a low resistance may express a logic "1" data bit value.

The plurality of resistive memory cells 12 each may include a resistive memory element 14 and an access device 16 for controlling a current flowing in the resistive memory element 14. According to the embodiment of the present invention, the resistive memory element 14 is called a memory cell or a memory material.

Further, the plurality of resistive memory cells 12 each may be implemented as a ReRAM, a phase change random access memory (PRAM), or a flash memory. The PRAM called a PCRAM or an ovonic unified memory (OUM) may use a phase change material for the resistive memory element 14.

Further, the resistive memory element 14 may be implemented as phase change materials having different resistances according a crystalline state or an amorphous state.

The access device 16 is called an isolation device, and may be implemented as a diode-type, an MOSFET-type, or a BJT-type. In the drawing, a diode-type access device 16 is illustrated, but the present invention is not necessarily limited thereto.

The row decoder 20 decodes a row address (RA) to select at least one word line (or one row) among the plurality of word lines WL1, WL2, WL3, . . . WLN. The column decoder 34 decodes a column address (CA) to select at least one bit line (or column) among the plurality of bit lines BL1 to BLn.

The column decoder 30 includes an ADC unit 32 and a column decoder 34. The ADC unit 32 may include a plurality of ADCs. The ADC unit 32 reflects a resistance state of the resistive array cell 12 to generate a digital code value. That is, the ADC unit 32 monitors the resistance state of the plurality of resistive memory cells 12 to generate a predetermined bit number of digital code value depending on a degree of deviation of the resistance state of the plurality of resistive memory cells from a target value. For example, one ADC is disposed for every eight bit lines to sense a current flowing in the bit line connected with the memory cell 12 by a unit of eight resistive memory cells 12 and generate a predetermined bit number of digital code value. The generated digital code value is provided to the control block 40.

In the case where a characteristic (for example, a resistance) of the resistive memory element 14 is changed according to a pulse duration of a pulse signal RESET, the control block 40 controls program data (or writing data) to repetitively perform a writing operation (or programming operation) and a verify read operation based on the digital code value associated with the resistance of the resistive memory cell 12 received from the ADC unit 30, while increasing a program (or writing) voltage applying time (or a programming time, a pulse duration) in the resistive memory cell 12.

Here, the writing operation (or programming operation) means an operation of making a resistance of the resistive memory element 14 of the resistive memory cell 12 be a high resistance or a low resistance by supplying a voltage pulse or a current pulse to the resistive memory cell 12.

The control block 40 may include a reading/writing circuit 42. Alternatively, the reading/writing circuit 42 may also be configured by a separate block which is not included in the control block 40. The control block 40 may control a DC generator 70 controlling an initial voltage magnitude and/or an initial voltage applying time. For example, the DC generator 70 may generate a pulse signal $V_{WR}$ in which the initial voltage magnitude and/or the initial voltage applying time (a pulse duration or a pulse width) increases as the number of programming operations (for example, resetting operations) increases.

Further, the DC generator 70 may generate a pulse signal $V_{WR}$ in which both the initial voltage applying time and the initial voltage magnitude increase as the number of writing operations (for example, resetting operations) increases.

The control block 40 according to the embodiment of the present invention uses a scheme in which at least one of a program time and a program voltage increases as the number of programming operations increases or as a program loop of a program cycle is repeated in order to control a threshold voltage distribution or a resistance distribution.

Accordingly, the control block 40 according to the embodiment of the present invention applies an incremental step pulse programming (ISPP) scheme to the program time in the programming operation, or applies the ISPP scheme to both the program time and the program voltage.

The interface 50 performs serves to transmit and receive program data (or writing data) or reading data between the control block 40 and a host (not illustrated).

Figure 3:
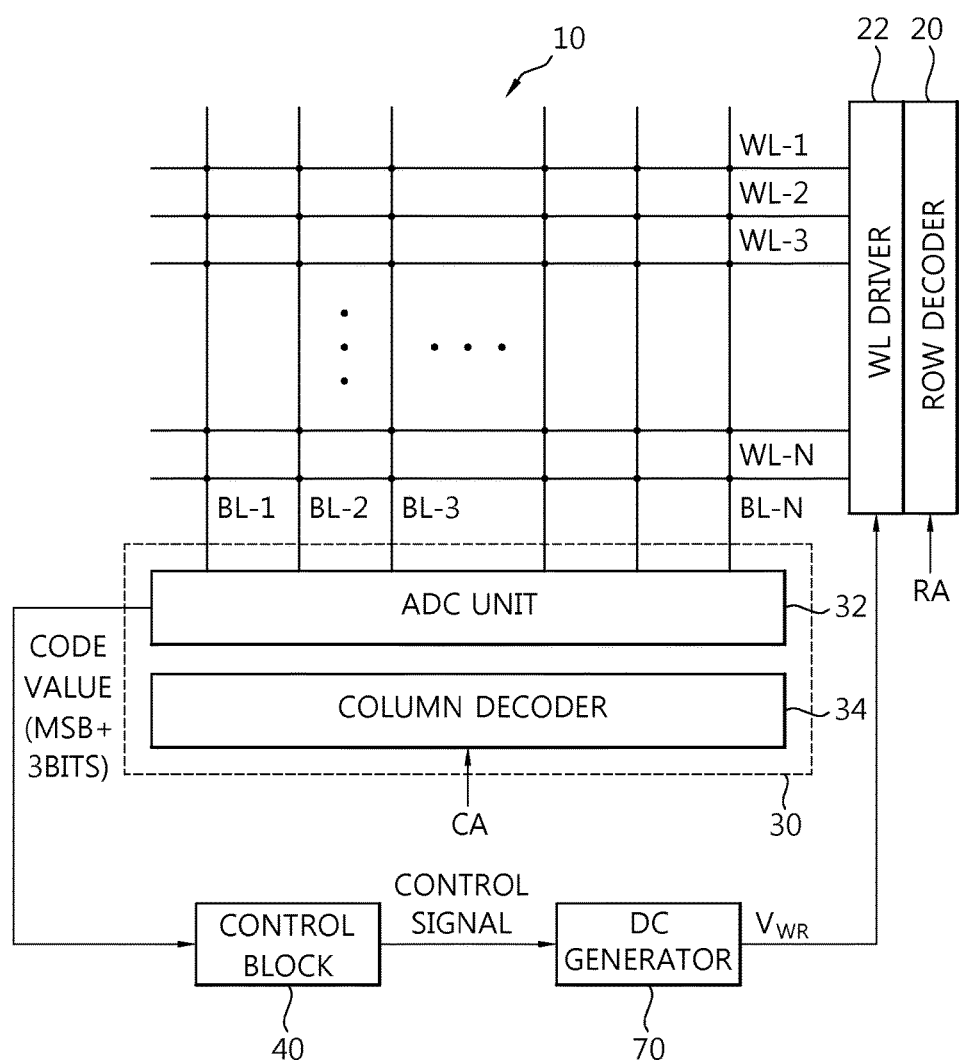
FIG. 3 is a block diagram for describing controlling a magnitude or an applying time of an initial voltage in an ISPP mode based on a digital code value of the semiconductor memory apparatus according to the embodiment of the present invention.

FIG. 3 is a block diagram for describing controlling a magnitude or an applying time of an initial voltage in an ISPP mode based on a digital code value of the semiconductor memory apparatus according to the embodiment of the present invention. As illustrated in FIG. 3, the semiconductor memory apparatus may include a memory cell array 10, a row decoder 20, a word line (WL) driver 22, an ADC unit 32, a control block 40, and a DC generator 70.

Referring to FIG. 3, a resistance of each memory cell 12 of the memory cell array 10 is sensed in the ADC unit 32 to be converted to a digital code value.

The row decoder 20 decodes the row address RA to select at least one of the plurality of word lines WL-1 to WL-N of the memory cell array 10, as described above. The word line driver 22 drives the word lines WL-1 to WL-N selected by supplying a power voltage $V_{WR}$ which is an output of the DC generator 70.

The ADC unit 32 is connected with the bit lines BL-1 to BL-N of the memory cell array 10 to sense a current value output through the bit lines BL-1 to BL-N and generate a digital code value. According to an embodiment of the present invention, a state according to the resistance of the memory cell 12 may be expressed, for example, a digital code value of 4 bits by using a 4-bit ADC instead of a bit line sense amplifier (BLSA) in the related art. However, it is not necessarily limited to the 4 bits and a digital code value having a different bit length value may be used.

A most significant bit (MSB) of the generated 4-bit digital code value may be used as a state value. The state value means a state value LRS or HRS including a SET(1) or a RESET(0). The state value means a binary value stored in which an actual memory cell is stored as a state value.

The rest of three lower bits, except for the most significant bit value from the 4-bit digital code value, is provided to the control block 40.

The control block 40 may classify the state value of the resistive memory cell into at least two levels based on the rest of the bit values. That is, one state value may be subdivided into several levels again, and the control block 40 may control a proper writing voltage to be applied to each memory cell 12 by applying different initial applying voltages or voltage applying times according to the subdivided levels. The control block 40 provides a control signal associated with voltage applying for a specific memory cell 12 to the DC generator 70.

The DC generator 70 applies the voltage applied to the resistive memory cell 10 to the driver 22. The driver 22 receives a voltage from the DC generator 70 to apply the received voltage to the corresponding resistive memory cell 12.

Figure 4:
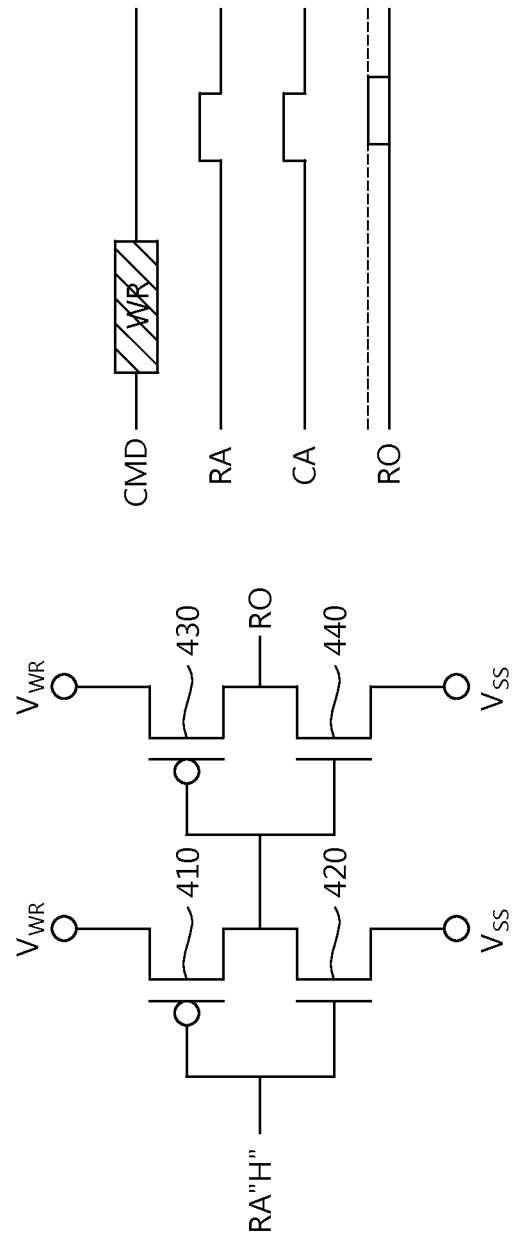
FIG. 4 is a diagram illustrating a circuit diagram and a timing diagram for describing an operation of a word line (WL) driver of the semiconductor memory apparatus according to the embodiment of the present invention.

FIG. 4 is a diagram illustrating a circuit diagram and a timing diagram for describing an operation of the word line (WL) driver 22 of the semiconductor memory apparatus according to the embodiment of the present invention. As illustrated in FIG. 4, the word line driver 22 includes a plurality of transistors 410, 420, 430, and 440.

As illustrated in a circuit diagram of the WL driver at the left of FIG. 4, a first PMOS transistor 410 is connected to a first NMOS transistor 420 in series. Further, a second PMOS transistor 430 is connected to a second NMOS transistor 440 in series. First, when a high H signal is input to the row address RA, the first PMOS transistor 410 is turned off and the first NMOS transistor 420 is turned on, and then when a $V_{SS}$ signal is provided to a gate of the second PMOS transistor 430, the second PMOS transistor 430 is turned on and the second NMOS transistor 440 is turned off, and as a result, a writing power voltage $V_{WR}$ is output to the row (R0, R1, R2 ... RN). In this way, the word line driver 22 applies the corresponding power voltage $V_{WR}$ to each memory cell 12 based on the decoded row address.

Referring to a right timing diagram of FIG. 4, after a writing WR command (CMD) signal is activated, a row address RA and a column address CA are applied, and the writing power voltage $V_{WR}$ is applied to the row (R0 among R0 to R7 of FIG. 5) which is a word line corresponding to the decoded word line of the word line driver 22.

Figure 5:
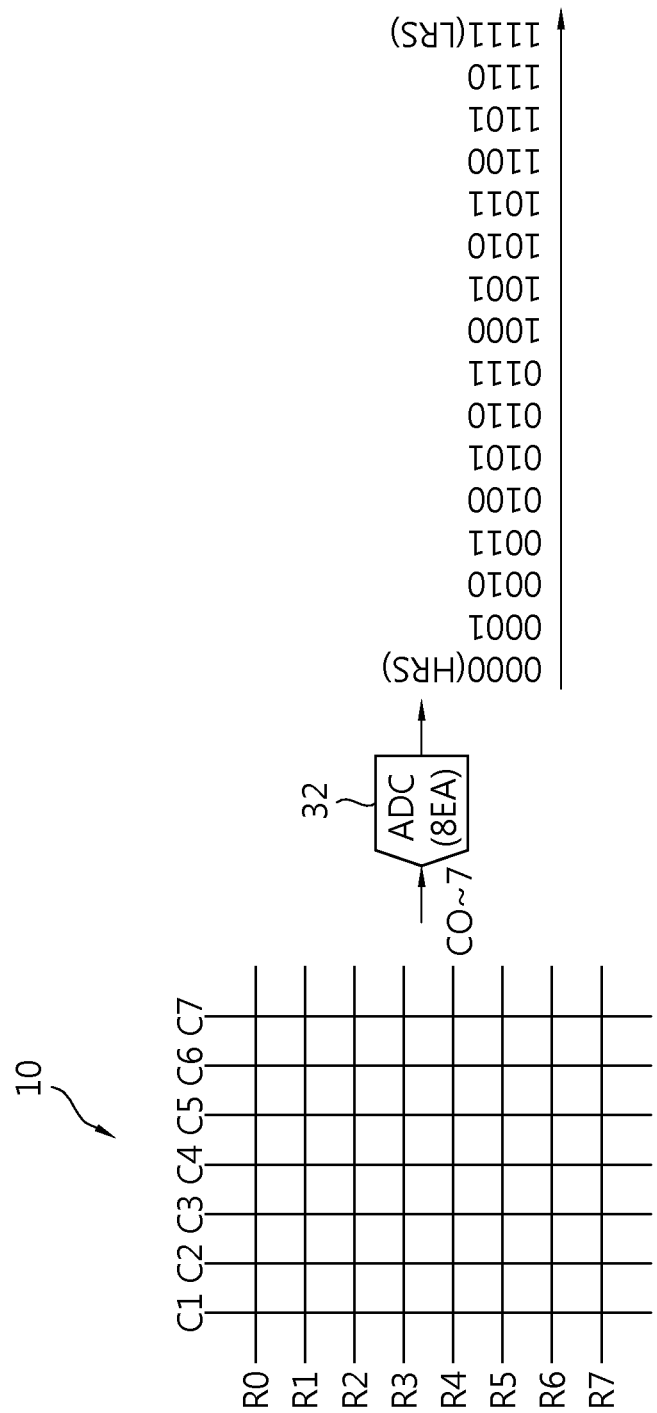
FIG. 5 is a schematic diagram for describing classifying cell states by using an ADC of the semiconductor memory apparatus according to the embodiment of the present invention.

FIG. 5 is a schematic diagram for describing classifying cell states by using the ADC 32 of the semiconductor memory apparatus according to the embodiment of the present invention. As illustrated in FIG. 5, the resistance in the memory cell 12 of the bit lines BL1 to BL8 is converted into a digital code value through the ADC 32. FIG. 5 is a case where the number of bit lines BL by the ADC 32 is eight, and the ADC 32 may represent a resistance state of the memory cell as a digital code value configured by three bit values including the most significant bit (MSB). In this case, the digital code value is determined according to a current value output from the bit lines BL1 to BL8. The embodiment represents an example in which the ADC 32 according to the embodiment of the present invention is applied to the memory cell array 10 configured by eight word lines R0 to R7 and eight bit lines C0 to C7, and eight sensing circuits (42-1, 42-2, ... 42-N) including the ADC 32 may be used.

Referring to FIG. 5, the semiconductor memory apparatus of the present invention uses the ADC 32 in the verify read process in order to efficiently perform the writing operation. A state LRS:1 or HRS:0 of the memory cells 12 may be divided into 16 digital codes by using the ADC 32. For example, the digital code value is determined according to a current value flowing in the bit line connected with the memory cell 12, and the ADC 32 may generate a digital code value of 0000 when the current value is 100 nA, and may set to generate a digital code value of 1111 when the current value is 1 uA. The reason is that a range of the current read according to a resistance change in the ReRAM is almost 100 nA to 1 uA. The setting may be controlled by coding through a user interface. In this case, using a 4-bit ADC 32 is assumed, and in some cases, 2 bits to several bits of ADC 32 may be used.

As illustrated in FIG. 4, the semiconductor memory apparatus according to the present invention may read a state value corresponding to SET(LRS "1") and RESET(HRS "0") which are sensed through the ADC 32 during the reading operation, as the most significant bit (MSB) value of the digital code value. In this case, the rest of three bit values except for the most significant bit represent the resistance distribution of the resistive memory cells 12. Accordingly, in the SET or RESET process of the verify read process, if the resistance is not sufficiently increased up to 1111 or 0000, a magnitude of the applying voltage or applying time of a pulse is increased until the resistance is increased to 1111 or 0000 through the ISPP method.

Figure 6:
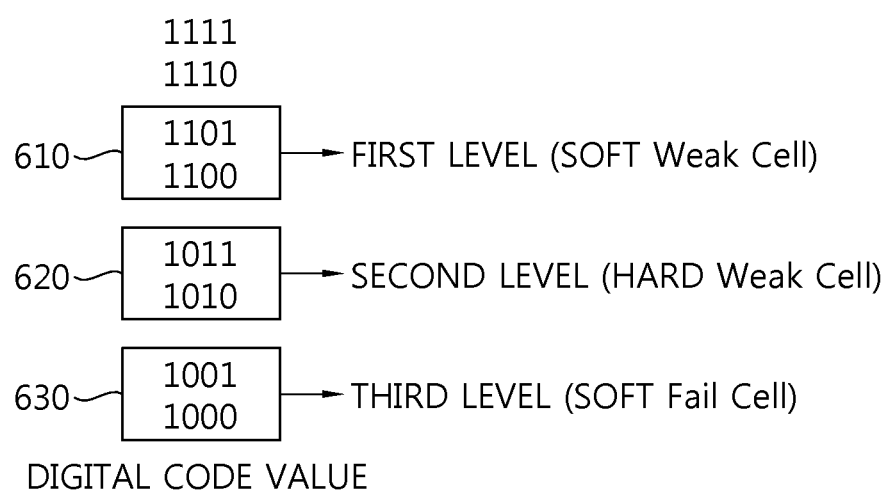
FIG. 6 is a schematic diagram illustrating a form of classifying a cell into three levels through a digital code value of the semiconductor memory apparatus according to the embodiment of the present invention.

FIG. 6 is a schematic diagram illustrating a form of classifying a cell into three levels through a digital code value of the semiconductor memory apparatus according to the embodiment of the present invention. As illustrated in FIG. 6, the semiconductor memory apparatus according to the embodiment of the present invention classifies one state value (the state value includes 0 or 1) into two or more levels.

Referring to FIG. 6, in a memory apparatus without using the ADC 32 in the related art, the state value output from the verify read result exists only 1 or 0. According to the embodiment of the present invention, when the state value having the same 1 value is converted into the digital code value through the ADC 32, the state value may be divided into 1000, 1001, 1010, 1011, 1100, 1101, 1110, and 1111. Of course, 1111 becomes a memory cell 12 having the best state, and 1000 becomes a memory cell 12 having the worst state. FIG. 6 illustrates an example of using the 4-bit ADC 32, in which a number at a left represents a digital code value of the ADC 32 according to a cell characteristic. According to the embodiment of the present invention, an adaptive ISPP (AISPP) method that acquires distribution information through the ADC 32, determines how much larger applying voltage is required according to the distribution, and implements a proper increase value. In FIG. 6, six values in a solid-line square have LRS state values (that is, an MSB value represents a state value of 1), and code values to perform the AISPP.

According to the embodiment of the present invention, a state value of the resistive memory cell 12 has a state value of '1', the state value read as the same '1' may be divided into several levels based on the digital code value. In the case where the 4-bit digital code value is acquired by using the 4-bit ADC 32, levels may be divided by three lower bits. That is, a digital code value of 11XX is defined as a first level 610 and may be classified as a 'SOFT Weak Cell', a digital code value of 101X is defined as a second level 620 and may be classified as a 'HARD Weak Cell', and finally, a digital code value of 100X is defined as a third level 630 and may be classified as a 'SOFT Fail Cell'. The plurality of resistive memory cells 12 may be grouped according to respective levels. That is, the plurality of resistive memory cells 12 may be managed by grouping the memory cell 12 having the digital code value of the first level 610 as a first group, the memory cell 12 having the digital code value of the second level 620 as a second group, and the memory cell 12 having the digital code value of the third level 630 as a third group.

Figure 7:
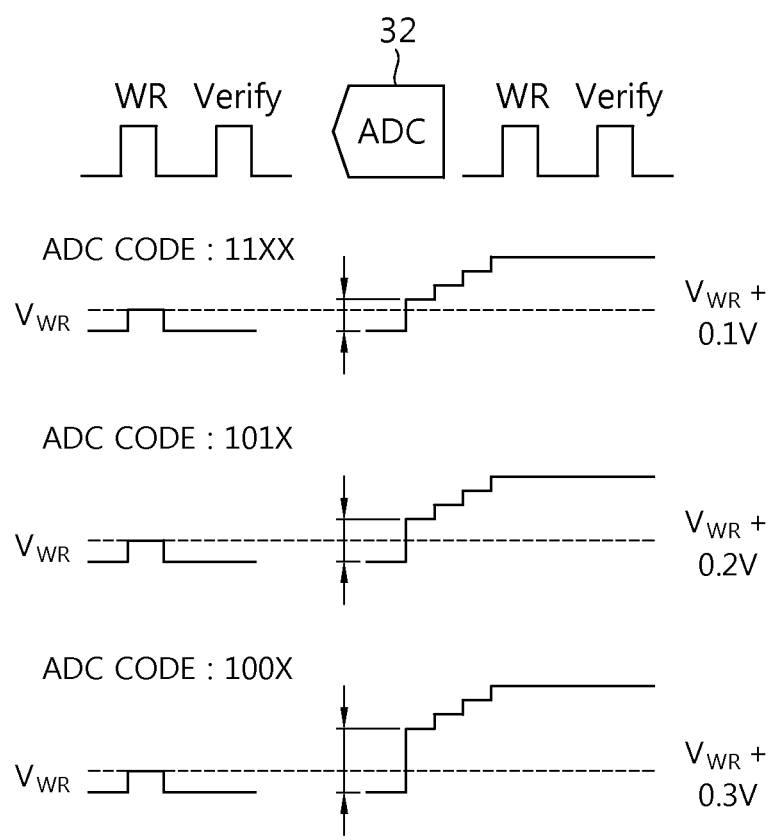
FIG. 7 is a diagram illustrating a form in which a magnitude of an initial applying voltage varies in an ISPP mode when a writing operation is performed by the semiconductor memory apparatus according to the embodiment of the present invention, based on a digital code value according to a cell characteristic.

FIG. 7 is a diagram according to an embodiment of the present invention illustrating a form in which a magnitude of an initial applying voltage varies in an ISPP mode when a writing operation is performed based on a digital code value according to a cell characteristic by the semiconductor memory apparatus. The upper portion of FIG. 7 illustrates that a writing and verifying control signal is converted into a digital code value through the ADC 32.

The three lower graphs of FIG. 7 are examples of the AISPP according to a digital code value, and initial voltages having different magnitudes are generated according to a digital code value in the ISPP mode during the writing operation. First, a writing power voltage, having a predetermined magnitude, is applied, and a resistance state of each memory cell 12 is determined through the verification operation. In the case where the resistance state is good and the verification is easily performed (for example, 111X), the writing operation may be finished without the ISPP mode. However, in the case where the resistance state is not good, the initial voltages having different magnitudes are applied in the ISPP mode.

For example, since the memory cells 12 of the first level 610 having the digital code value of 11XX have small resistances to be corrected (Soft weak cell), the memory cells 12 may perform the same step as the existing ISPP step. That is, the writing operation is performed through a predetermined voltage value and applying time set as initial voltage magnitude and applying time and then increased by the same voltage step magnitude. In addition, since the 101X has a relatively worse cell characteristic than the memory cell 12 of the first level 610 (Hard weak cell), the initial voltage step size is relatively larger when applying the ISPP, and the next voltage step size is applied equally to the existing ISPP method. Similarly, since the 100X corresponds to the worst cell (Soft fail cell), the initial voltage step size is largest when applying the ISPP. Particularly, in the case of the worst cell having the digital code value of 100X, a maximum voltage is applied and the application is repeated at the reference number of times or more, and when there is no response, the worst cell is defined as a hare fail to be excluded.

According to the embodiment of the present invention, even in the case of the worst cell, since the incremental step of the ISPP is minimized, the writing time may be reduced, and further, unnecessary current consumption may be reduced.

Figure 8:
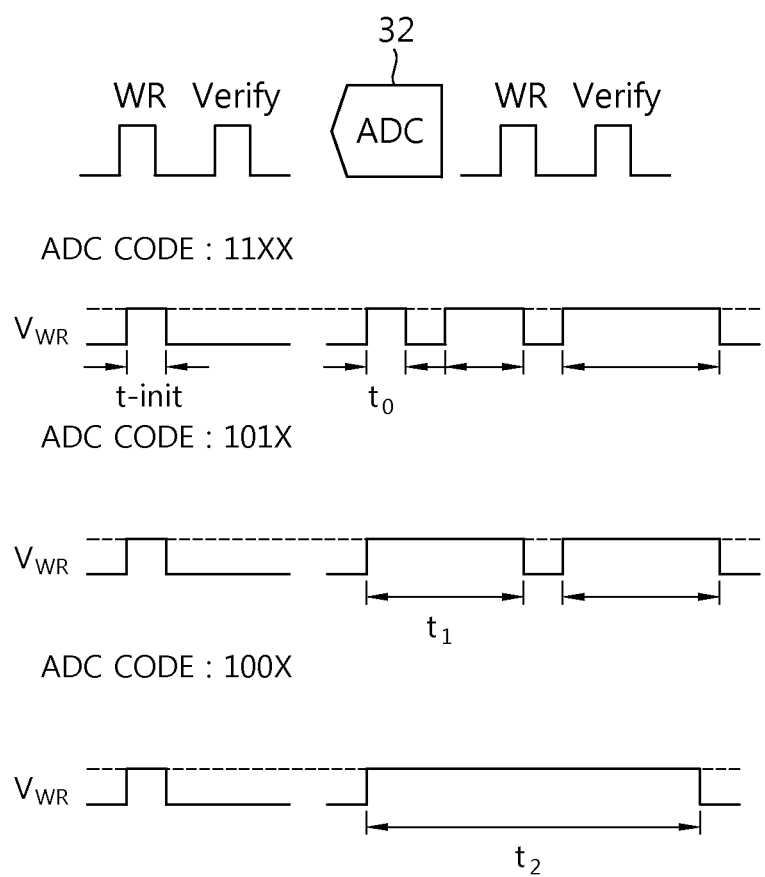
FIG. 8 is a diagram illustrating a form in which an initial voltage applying time varies in an ISPP mode when a writing operation is performed by the semiconductor memory apparatus according to the embodiment of the present invention, based on a digital code value according to a cell characteristic.

FIG. 8 is a diagram illustrating a form in which an initial voltage applying time varies in an ISPP mode when a writing operation is performed based on a digital code value according to a cell characteristic by the semiconductor memory apparatus according to the embodiment of the present invention.

In the resistive memory, the resistance is changed according to a voltage applying number (or time) due to a characteristic of the resistance. That is, when a lot of pulses are input, the resistance is gradually increased and eventually saturated. Such a phenomenon may be applied equally to a case where the pulse is input for a long time. That is, when the voltage is input for a long time, the resistance is increased. Accordingly, a resistance change according to the voltage applying time may be applied to the AISPP.

Referring to FIG. 8, according to another embodiment of the present invention, the initial voltage applying times may be different from each other when performing the AISPP based on the digital code value according to a cell characteristic. For example, since the memory cells 12 of the first level 610 having the digital code value of 11XX have small resistances to be corrected (Soft weak cell), the memory cells 12 perform the exiting ISPP step like the case of controlling the magnitude of the initial applying voltage (see FIG. 7). That is, the voltage is initially applied for a predetermined voltage applying time to in the ISPP mode, and thereafter, the writing operation is performed while the voltage applying time is increased. Since the 101X (the second level 620) has a relatively bad cell characteristic (Hard weak cell), the initial voltage applying time is increased in the ISPP mode. Similarly, in the case of the worst cell (the third level 630) having the digital code value of 100X (Soft fail cell), the initial voltage applying time is longest in the ISPP mode as compared with the first and second levels 610 and 620. In the case of the worst cell, a maximum voltage in which reset does not occur by the SET voltage is applied and the application is repeated at the reference number of times, and when there is no response, the cell is defined as the hard fail to be excluded.

Even in the embodiment of the controlling of the initial voltage applying time, different voltage applying times are set according to the cell characteristic, and as a result, the number of ISPP steps may be reduced, thereby efficiently restoring a desired resistance.

According to yet another embodiment of the present invention, controlling of the initial applying voltage and controlling of the applying time in the ISPP mode may be simultaneously performed (combination of FIGS. 6 and 7).

Figure 9A:
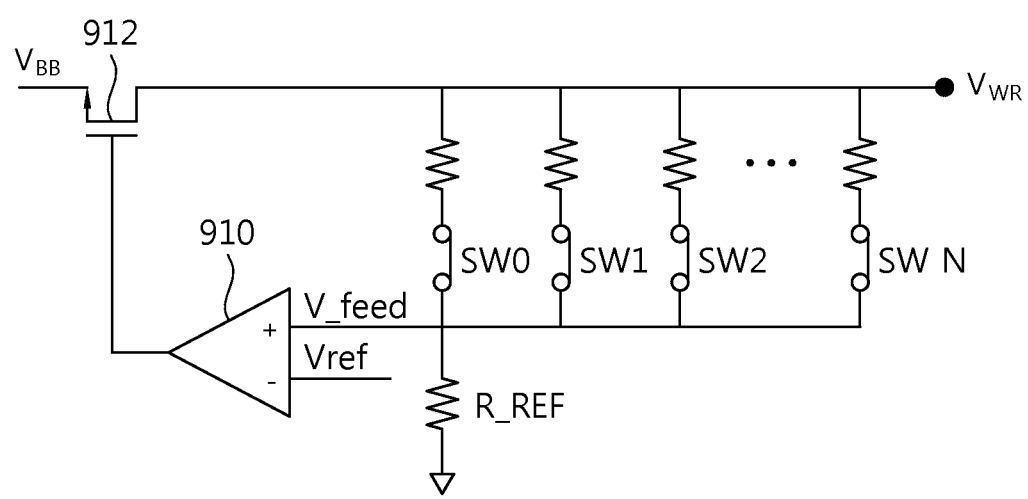
FIGS. 9A to 9C are diagrams illustrating examples in which the number of off initial switches varies when a writing operation is performed by the semiconductor memory apparatus according to the embodiment of the present invention.
Figure 9B:
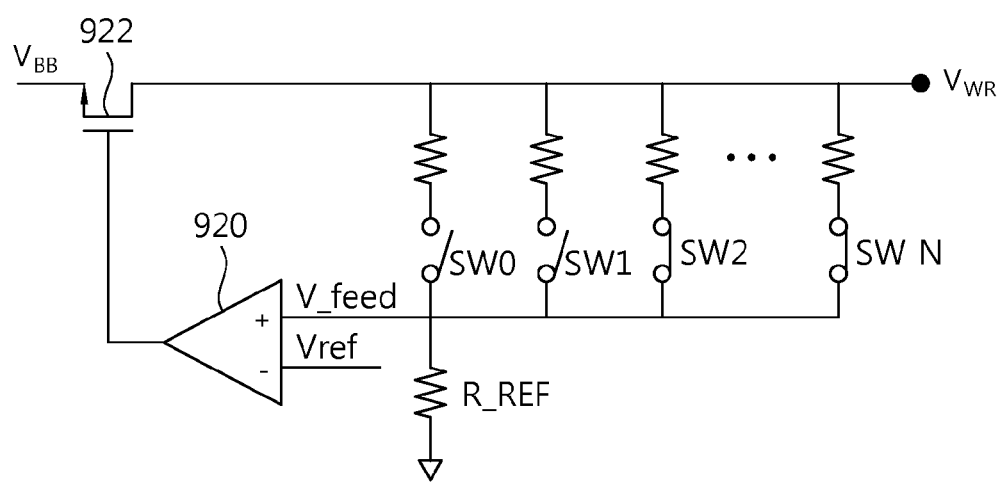
Figure 9C:
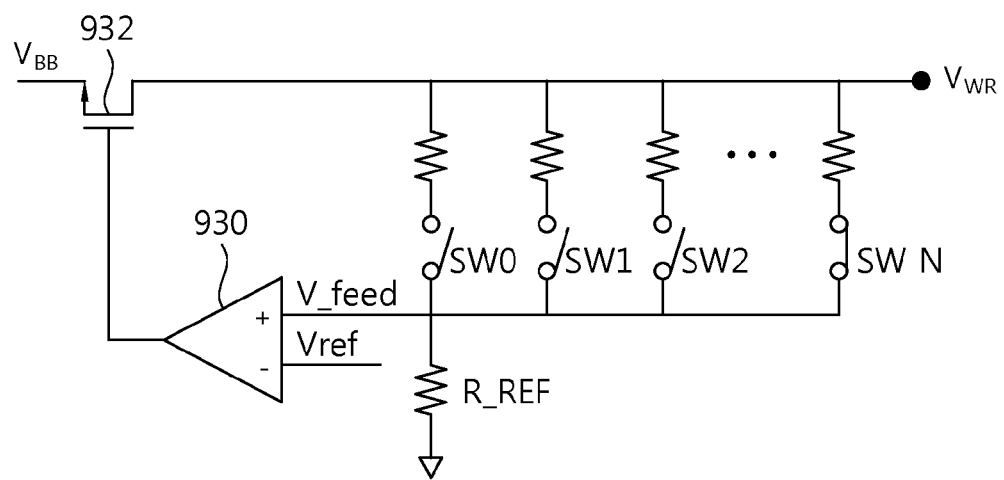

FIGS. 9A to 9C are diagrams illustrating examples in which the number of off initial switches varies when a writing operation is performed by the semiconductor memory apparatus according to the embodiment of the present invention. FIG. 9A is a diagram illustrating a state in which all switches are turned on in an initial state, FIG. 9B is a diagram illustrating a state in which a switch 0 and a switch 1 SW0 and SW1 are turned off in the case of a hard weak cell of a second level, and FIG. 9C is a diagram illustrating a state in which a switch 0 to a switch 2 SW0 to SW2 are turned off in the case of a soft fail cell of a third level.

Referring to FIG. 9A, an embodiment in which a control signal is received from the control block 40 to control generation of a DC voltage in the DC generator 70 is illustrated, and a circuit of the DC generator 70 includes a plurality of switches SW0 to SWN for controlling the voltage application. Among the switches, only some switches variably operate. In the embodiment, a switch 0 to a switch 2 SW0 to SW2 variably operate by a digital code value, and the rest of the switches SW3 to SWN perform a general ISPP. As illustrated in FIG. 9A, in the circuit of the DC generator 70, a resistor and the switches SW0 to SWN are connected to each other in series between a $V_{WR}$ node that applies a writing power voltage to the memory cell 12 and a + input terminal of the AMP 810, the resistors and the switches SW0 to SWN which are connected to each other in series are connected to each other in parallel, and the resistor and the switches SW0 to SWN which are connected to each other are connected to a resistor R_REF in series so that voltage distribution between the $V_{WR}$ and the $V_{SS}$ is performed. A $V_{BB}$ is provided to a source node of the NMOS transistor 912 ($V_{BB}<V_{WR}<V_{SS}$), and a gate of the NMOS transistor 912 is connected to an output terminal of the AMP 910. Here, the AMP 910 and the NMOS transistor 912 serve to supply or remove charges of the $V_{WR}$ node according to a change of a V_feed by comparing a Vref and the V_feed.

The configuration of the NMOS transistor 912 illustrated according to the embodiment of the present invention may adopt another element serving as the switch, and is not necessarily limited to the NMOS transistor 912.

It is assumed that a voltage applied to the memory cell 12 is a negative voltage. When Vref=−1V, and $V_{WR}$=−1.5V in an initial state, all switches SW0 to SWN are turned on in the initial stage. A $V_{WR}$ voltage is a negative voltage, and in this specification, the $V_{WR}$ voltage represents only an absolute value. When the number of switches which are turned off among the switch 0 to the switch 2 SW0 to SW2 increases, a combined resistance is increased, the V_feed voltage increases by voltage distribution, and as a result, the absolute value of the initial applying voltage $V_{WR}$ increases. In the initial state, all the switches SW0 to SWN are turned on and thus a low voltage is applied. Thereafter, in the case of the first level 610 having the digital code value of 11XX, the switches are turned off one by one, and then the initial voltage is applied.

Referring to FIG. 9B, the voltage applied to the memory cell 12 of the second level 620 having the digital code value of 101X turns off the two switches SW0 and SW1, and thereafter, the initial voltage is applied. Here, the AMP 920 and the NMOS transistor 922 perform the same role as those illustrated in FIG. 9A.

Referring to FIG. 9C, the voltage applied to the memory cell 12 of the third level 630 having the digital code value of 100X turns off the three switches SW0 to SW2, and thereafter, the initial voltage is applied. Accordingly, the control signal according to the digital code value is received from the control block 40, and the largest voltage is applied to the memory cell 12 as compared with the memory cells 12 of the first and second levels 610 and 620. Here, the AMP 930 and the NMOS transistor 932 perform the same role as those illustrated in FIG. 9A.

Unlike the embodiment illustrated in the drawing, in order to make the voltages applied to the memory cells 12 of the first level 610, the second level 620, and the third level 630, the number of opened and closed switches does not particularly vary one by one and in some cases, in the case of 11XX, the switches are turned off one by one and, N 101X switches which are initially turned off and N+H 100X switches are turned off to set an AISPP initial voltage differently.

As described above, after the initial voltages are differently applied, while the switches are turned off one by one like the existing ISPP, the writing operation is performed.

A method of controlling the magnitude of the initial voltage and the voltage applying time of the AISPP of the present invention exemplifies the ReRAM, but may be applied to all the resistive memories, and the circuit for generating the DC may be not necessarily configured by only the circuit illustrated in FIGS. 9A to 9C, and may be configured by any other form.

Figure 10:
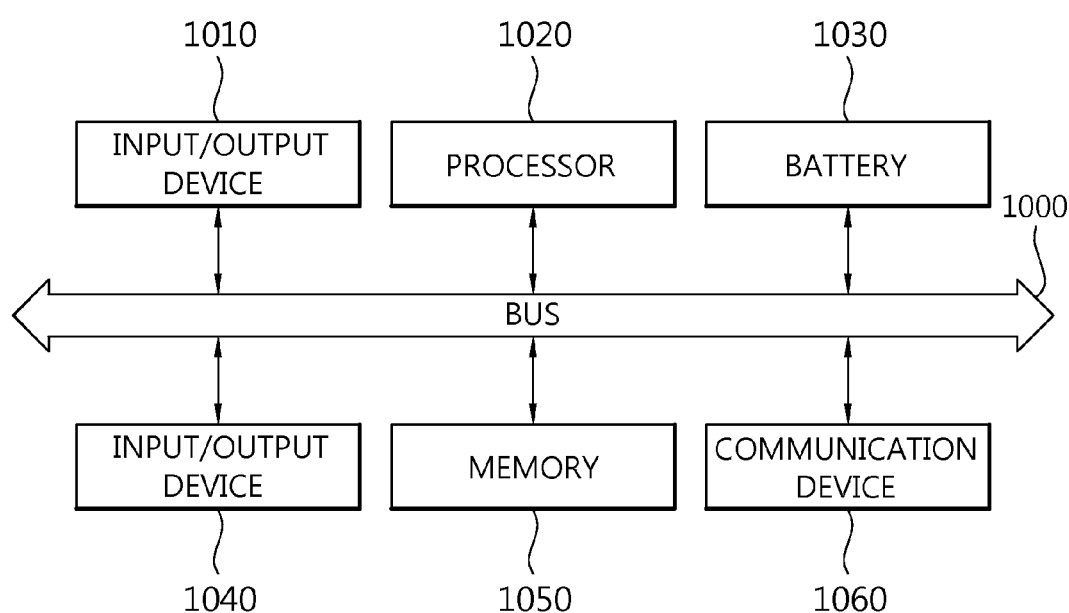
FIG. 10 is a schematic block diagram of a semiconductor memory system according to an embodiment of the present invention.

FIG. 10 is a schematic block diagram of a semiconductor memory system according to an embodiment of the present invention. A semiconductor memory system such as a computer includes a memory apparatus 1050 connected to a bus 1000, and a processor 1020.

The processor 1020 may entirely control a writing operation, a reading operation, or a verify read operation of the memory apparatus 1050. For example, the processor 1020 outputs a command and writing data for controlling the writing operation of the memory apparatus 1050. Further, the processor 1020 may generate a command for controlling the reading operation or the verify read operation of the memory apparatus 1050. Accordingly, the control block 40 of the semiconductor memory apparatus 1050 may perform the verify read operation or the programming operation (or the writing operation) in response to a control signal (for example, an nPRG, a DIS, a WEN, or a REN) output form the processor 1020.

In the case where the semiconductor memory system is implemented as a portable application, the semiconductor memory system may further include a battery 1030 for supplying operation power to the memory apparatus 1050 and the processor 1020.

The portable application may include a portable computer, a digital camera, personal digital assistants (PDA), a cellular phone, an MP3 player, a portable multimedia player (PMP), an automotive navigation system, a memory card, a smart card, a game machine, an electronic dictionary, or a solid state disc.

The semiconductor system may further include an interface for transmitting and receiving data to and from an external data processing device, for example, input/output devices 1010 and 1040.

In the case where the semiconductor system is a wireless system, the semiconductor system may further include a memory apparatus 1050, a processor 1020, and a communication device 1060. In this case, the communication device 1060 is connected to the processor 1020 as a wireless interface and may wirelessly transmit and receive the data to and from an external wireless device (not illustrated) through the system bus 1000.

For example, the processor 1020 processes the data input through the communication device 1060 to store the processed data in the memory apparatus 1050, and further, the data stored in the memory apparatus 1050 may be read to be transmitted to the wireless interface 1060.

The wireless system including the communication device 1060 may be a wireless device such as a PDA, a portable computer, a wireless telephone, a pager, and a digital camera, an RFID reader, or an RFID system. Further, the wireless system may be a wireless local area network system or a wireless personal area network (WPAN) system. Further, the wireless system may be a cellular network.

Figure 11:
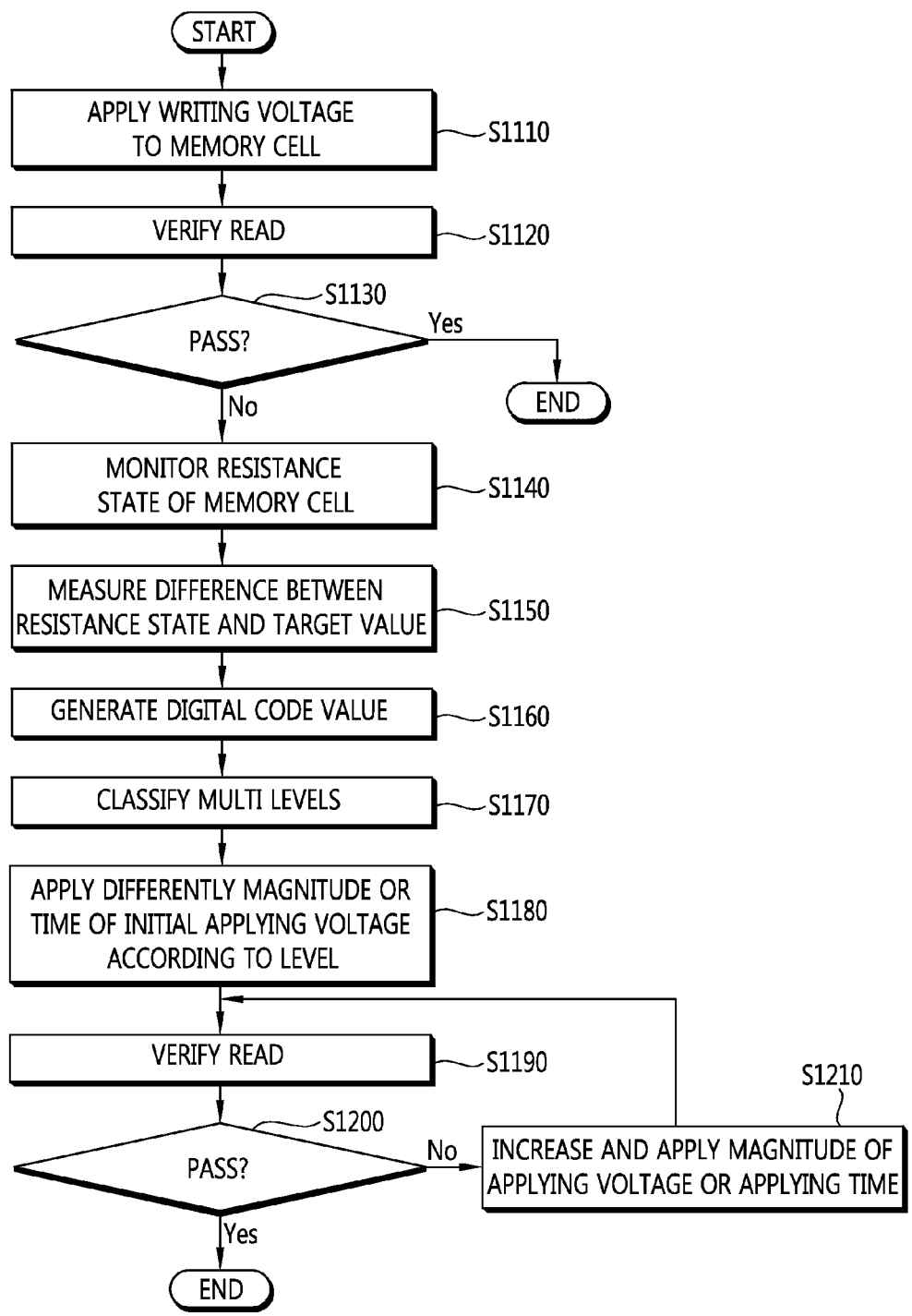
FIG. 11 is a flowchart for describing a program method of a semiconductor memory apparatus according to an embodiment of the present invention.

FIG. 11 is a flowchart for describing a program method of a semiconductor memory apparatus according to an embodiment of the present invention. Referring to FIG. 11, the semiconductor memory apparatus applies a writing power voltage to the memory cell during the writing operation (S1110). In addition, the verify read is performed (S1120). As a result of the verify read, when a state value may be accurately sensed, the sensed state value is output and the writing process ends (S1130). When the state value is not accurately sensed, first, a resistive state of the memory cell 12 is monitored by entering into the ISPP mode (S1140). In addition, as the monitoring result, a difference between the resistive state and a target value is measured (S1150). A digital code value is generated based on the measured result (S1160). According to the embodiment of the present invention, the digital code value may be generated through the ADC 32 connected to the bit lines BL1 to BLN.

The generated digital code value is transmitted to the control block 40, and the control block 40 classifies the state value into multi levels based on the digital code value (S1170). That is, one state value (including a SET '1' value and a RESET '0' value) may be classified into at least two levels. According to the embodiment of the present invention, a 4-bit digital code value may be generated through a 4-bit ADC 32, and in this case, one state value may be classified into three levels. The plurality of memory cells 12 may be grouped according to the classified levels.

Each memory cell is grouped by the multi levels, and a magnitude of the initial applying voltage or an applying time varies according to a level to apply the voltage to the memory cell (S1180). In this case, in the cells in which the resistance state is not good, the magnitude of the initial applying voltage becomes large or the applying time of the initial applying voltage becomes longer, and on the contrary, the cells in which the resistance state is good apply the initial voltage.

In the case of the memory cell 12 of the first level 610 having the digital code value of 11XX, the initial voltage is applied to the memory cell 12 by a predetermined initial applying voltage and/or initial applying time in the ISPP mode during the writing operation.

In the case of the memory cell 12 of the second level 620 having the digital code value of 101X, the initial voltage is applied to the memory cell 12 at the higher initial applying voltage and/or the longer initial applying time than the memory cell 12 of the first level 610 in the ISPP mode during the writing operation.

In the case of the memory cell 12 of the third level 630 having the digital code value of 100X, the initial voltage is applied to the memory cell 12 at the highest initial applying voltage and/or the longer initial applying time as compared with the memory cell 12 of the first and second levels 610 and 620 in the ISPP mode during the writing operation.

The worst cell which is not included in the first to third levels 610, 620, and 630 as a hard fail may be excluded as a dead cell.

The ISPP initial voltage is applied and then the verify read is performed again (S1190). As a result of the verify read, when a state value may be accurately sensed, the sensed state value is output and the writing process ends (S1200).

When the state value is not accurately sensed, the voltage is applied to the memory cell by increasing the voltage magnitude and/or the applying time by a predetermined interval as compared with the applied voltage (S1210), and the verify read process is repetitively performed.

Figure 12:
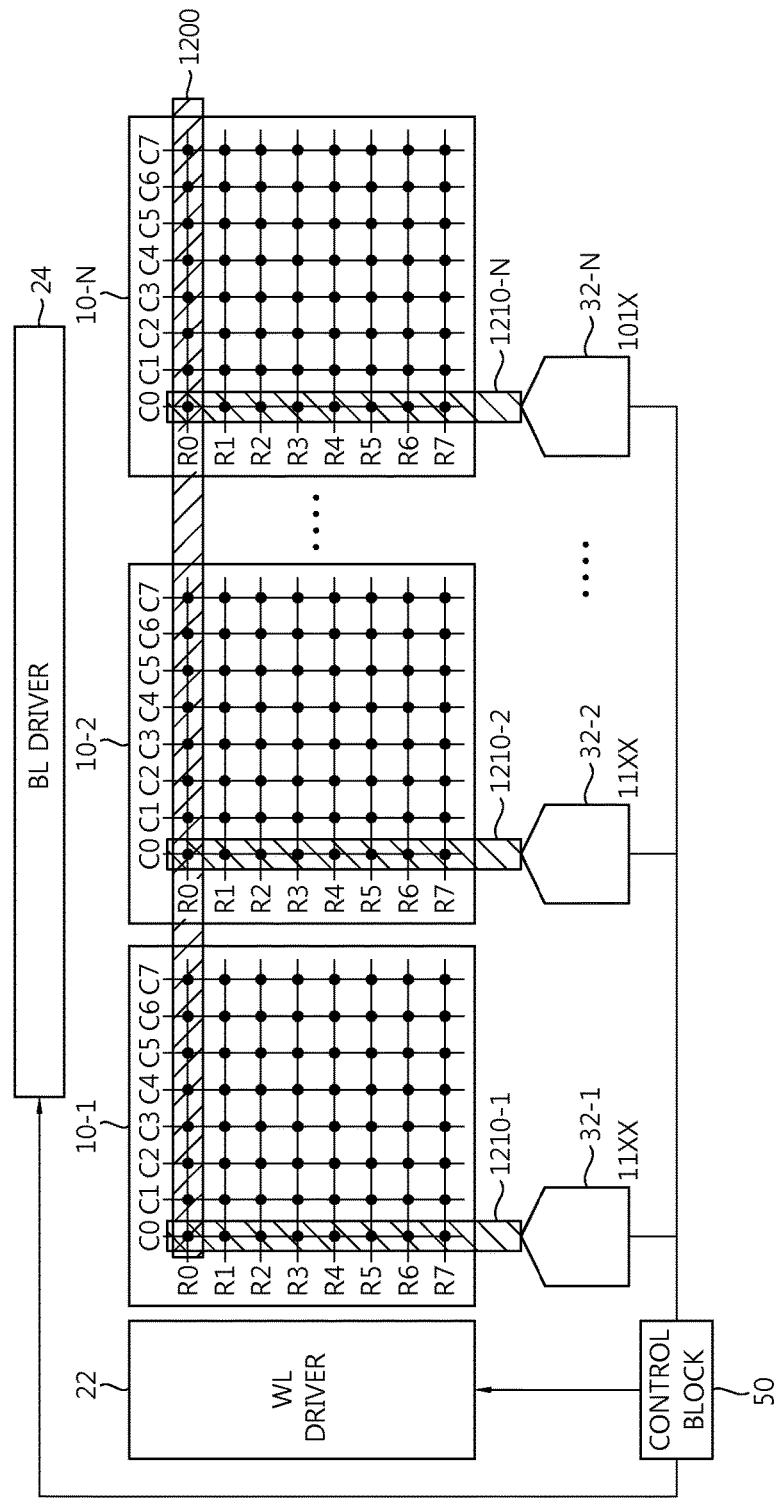
FIG. 12 is a diagram for describing a layout of multi power lines of a semiconductor memory apparatus according to another embodiment of the present invention.

FIG. 12 is a diagram for describing a layout of multi power lines of a semiconductor memory apparatus according to another embodiment of the present invention. As illustrated in FIG. 12, the semiconductor memory apparatus according to another embodiment of the present invention include a word line driver 22 and a bit line driver 24 in order to applying an allocated voltage to each memory cell 10 during a multi-writing operation.

Referring to FIG. 12, the memory cells 10-1, 10-2, . . . , 10-N may be formed in a plurality of matrixes. One memory cell matrix 10-1, 10-2, . . . , 10-N may be configured by eight columns and eight rows. The multi-writing operation means performing the writing operation by several k byte unit by sharing a power line in which the voltage is applied to the plurality of memory cell matrixes 10-1, 10-2, . . . , 10-N. In this case, when the initial word line voltage varies according to a characteristic of the cell in the ISPP mode, a target word line voltage value varies every cell, and as a result, there is a problem in the case of sharing the word line.

According to the embodiment of the present invention, the semiconductor memory apparatus acquires the resistance state of each memory cell 10 through ADCs 32-1, 32-2, . . . , 32-N, and may control the initial applying voltage of the ISPP mode in response to the resistance state of the memory cell 10. Particularly, when the plurality of memory cells 10 connected to one word line share one power line 1200, the voltage for each memory cell 10 may be controlled through the bit line driver 24 in the ISPP mode. The semiconductor memory apparatus according to the embodiment of the present invention acquires the resistance state for each memory cell 10 because the ADCs 32-1, 32-2, . . . , 32-N are connected to the respective bit lines 1210-1, 1210-2, . . . , 1210-N, and provides the acquired resistance state information to a control block 50. The control block 50 controls a predetermined initial applying voltage and a step-by-step increasing voltage to be provided to the memory cell 10 through the word line driver 22 like the exiting ISPP mode, and controls different initial applying voltages to be provided for each memory cell 10 according to the resistance state information acquired through the bit line driver 24. That is, the ISPP mode initial applying voltage provided through the bit line driver 24 may be variable in response to the resistance state of each memory cell 10.

Figure 13:
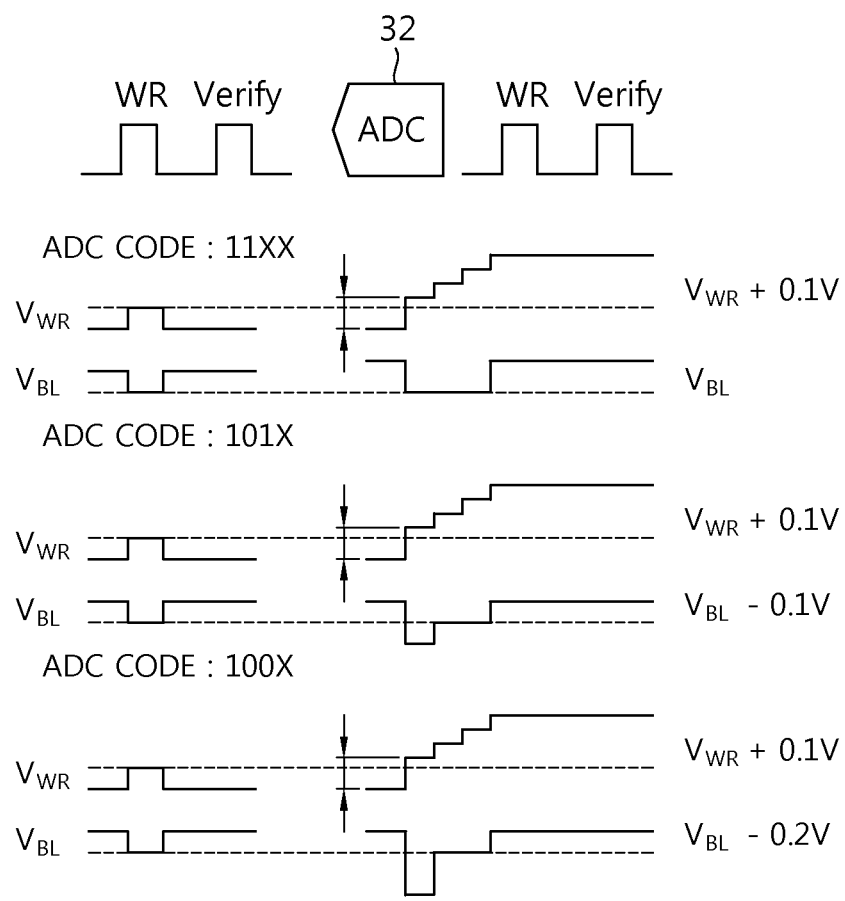
FIG. 13 is a diagram illustrating a form in which a magnitude of an initial applying voltage varies in an ISPP mode when a writing operation is performed based on a digital code value according to a cell characteristic by the semiconductor memory apparatus according to the embodiment of the present invention.

FIG. 13 is a diagram illustrating a form in which a magnitude of an initial applying voltage varies in an ISPP mode when a writing operation is performed based on a digital code value according to a cell characteristic by the semiconductor memory apparatus according to the embodiment of the present invention. An upper drawing of FIG. 13 illustrates that a writing and verifying control signal is converted into a digital code value through the ADC 32.

Three lower graphs of FIG. 13 are examples of the AISPP according to the digital code value, and the initial applying voltages provided through the word lines during the writing operation according to the digital code value are the same as each other, but the voltages provided through the bit lines generate initial voltages having different magnitudes. For example, since the memory cells 12 of the first level 610 having the digital code value of 11XX have small resistances to be corrected (Soft weak cell), the memory cells 12 may perform the same step as the existing ISPP step. That is, while the predetermined voltage value and applying time are equally applied through the word line and the bit line and increased by the same voltage step size through the word line, the writing operation is performed. In addition, since the 101X has a relatively worse cell characteristic than the memory cell 12 of the first level 601 (Hard weak cell), the voltage provided through the word line in the ISPP mode is the same as that in the existing ISPP mode, but the voltage provided through the bit line has a relatively large initial voltage step size (here, the size means an absolute value of the voltage) (in the embodiment, VBA-0.1 V), and the next process is applied the same as the existing ISPP mode. Similarly, since the 100X corresponds to the worse cell (Soft fail cell), the word line voltages are the same as each other in the ISPP mode, but the initial voltage step size provided through the bit line becomes largest (in the embodiment, VBA-0.2V). Particularly, in the case of the worst cell having the digital code value of 100X, a maximum voltage is applied through the bit line, and the application is repeated at the reference number of times or more, and when there is no response, the worst cell is defined as the hare fail to be excluded.

While the invention has been shown and described with respect to the preferred embodiments, it will be understood by those skilled in the art that various changes and modifications may be made without departing from the spirit and scope of the invention as defined in the following claims.

What is claimed is:

1. A semiconductor memory apparatus, comprising:
   resistive memory cells; and
   a control block configured to control an incremental step size in an incremental step pulse programming (ISPP) mode for the resistive memory cells to be varied based on digital code values reflecting susceptibility in programming of each of the resistive memory cells,
   wherein the control block classifies one state value of the resistive memory cells, in which the one state value comprises SET(1) or RESET(0), into at least two levels based on the digital code value, and
   wherein the control block reads a most significant bit value of the digital code value, and classifies levels of the one state value based on bit values except for the most significant bit value to group the resistive memory cells according to the classified levels.

2. The semiconductor memory apparatus of claim 1, wherein:
   the digital code value is generated as the digital code value of at least 2 bits according to a degree of deviation of the resistance states of the resistive memory cells from a target value by monitoring the resistance of the resistive memory cells.

3. The semiconductor memory apparatus of claim 1, further comprising:
   an analog to digital converter (ADC) configured to generate the digital code value.

4. The semiconductor memory apparatus of claim 1, wherein:
   the control block classifies the one state value of the resistive memory cell into three levels, comprising a first level, a second level and a third level, based on three lower bits of the digital code value when the digital code value has a length value of 4 bits, and groups the resistive memory cells according to the first to third levels.

5. The semiconductor memory apparatus of claim 4, wherein:
   the control block controls
   the resistive memory cells of the first level to perform the ISPP mode while sequentially increasing a voltage magnitude or a voltage applying time based on a predetermined initial voltage magnitude or initial voltage applying time,
   the resistive memory cells of the second level to perform the ISPP mode while applying the initial voltage magnitude or the initial voltage applying time, which is larger or longer, respectively, than the resistive memory cell of the first level, and
   the resistive memory cells of the third level to perform the ISPP mode while applying the initial voltage magnitude or the initial voltage applying time, which is largest or longest, respectively, relative to the resistive memory cells of the first and second levels.

6. The semiconductor memory apparatus of claim 1, further comprising:
   a DC generator including switches to apply different initial voltages to the resistive memory cells.

7. The semiconductor memory apparatus of claim 6, wherein:
   the DC generator controls opening and closing of the switches based on a control signal associated with an initial voltage magnitude or an initial voltage applying time for the resistive memory cells to apply the different initial voltages to the resistive memory cells.

8. The semiconductor memory apparatus of claim 1, wherein:
   when the resistive memory cells connected to one word line simultaneously perform a writing operation by sharing one power line, the control block controls a magnitude of an initial voltage applied through a bit line to be varied according to the digital code value while initial applying voltages through a word line are the same as each other.

9. The semiconductor memory apparatus of claim 1, wherein:
the step size comprises at least one of voltage magnitude, current magnitude, and applying time.

10. A program method of a semiconductor memory apparatus, comprising:
generating digital code values reflecting susceptibility in programming of individual resistive memory cells; and
controlling incremental step size to be varied in an ISPP mode with respect to each of the resistive memory cells based on the generated digital code value,
wherein the controlling includes classifying one state value of the resistive memory cells, comprising SET(1) or RESET(0), into at least two levels based on the digital code value, and
wherein the controlling includes reading a most significant bit value of the digital code value as a state value, and classifying the one state value of the resistive memory cells into at least two levels based on the rest of bit values except for the most significant bit value.

11. The program method of a semiconductor memory apparatus of claim 10, wherein:
the generating of the digital code value includes generating the digital code value having predetermined bits according to a degree of deviation of the resistance states of the resistive memory cells from a target value by monitoring the resistance of each of the resistive memory cells.

12. The program method of a semiconductor memory apparatus of claim 10, wherein:
the controlling includes classifying the one state value of the resistive memory cells into three levels, comprising a first level, a second level and a third level, based on three lower bits of the digital code value when the digital code value has a length value of 4 bits.

13. The program method of a semiconductor memory apparatus of claim 12, wherein:
the controlling includes controlling
the resistive memory cells of the first level to perform the ISPP mode while sequentially increasing a voltage magnitude or a voltage applying time based on a predetermined initial voltage magnitude or initial voltage applying time,
the resistive memory cells of the second level to perform the ISPP mode while applying the initial voltage magnitude or the initial voltage applying time, which is larger or longer than the resistive memory cells of the first level, and
the resistive memory cells of the third level to perform the ISPP mode while applying the initial voltage magnitude or the initial voltage applying time, which is largest or longest relative to the resistive memory cells of the first and second levels.

14. The program method of a semiconductor memory apparatus of claim 10, further comprising:
applying different initial voltages to the resistive memory cells based on a control signal associated with an initial voltage magnitude or an initial voltage applying time.

15. The program method of a semiconductor memory apparatus of claim 10, wherein:
when the resistive memory cells connected to one word line simultaneously perform a writing operation by sharing one power line, the controlling includes controlling a magnitude of an initial voltage applied through a bit line to be varied according to the digital code value while initial applying voltages through a word line are the same as each other.

16. The program method of a semiconductor memory apparatus of claim 10, wherein:
the step size comprises at least one of voltage magnitude, current magnitude, and applying time.

17. A semiconductor memory system, comprising:
a semiconductor memory apparatus; and
a processor for controlling a writing operation and a verify read operation of the semiconductor memory apparatus,
wherein the semiconductor memory apparatus includes resistive memory cells; and
a control block configured to control incremental step size in an ISPP mode for the resistive memory cells to be varied based on digital code values each reflecting susceptibility in programming of each of the resistive memory cells,
wherein the control block classifies one state value of the resistive memory cells, in which the one state value comprises SET(1) or RESET(0), into at least two levels based on the digital code value, and
wherein the control block reads a most significant bit value of the digital code value, and classifies levels of the one state value based on bit values except for the most significant bit value to group the resistive memory cells according to the classified levels.

18. The semiconductor memory system of claim 17, wherein:
the digital code value is generated as the digital code value of predetermined bits according to a degree of deviation of the resistance states of the resistive memory cells by monitoring the resistance of the resistive memory cells.

19. The semiconductor memory system of claim 17, wherein:
the step size comprises at least one of voltage magnitude, current magnitude, and applying time.

* * * * *